(12) United States Patent
Onishi

(10) Patent No.: US 8,104,722 B2
(45) Date of Patent: Jan. 31, 2012

(54) TRANSPORTING SYSTEM, AND METHOD OF CONTROLLING THE TRANSPORTING SYSTEM

(75) Inventor: Hisashi Onishi, Ise (JP)

(73) Assignee: Muratec Automation Co., Ltd, Kyoto (JP)

(*) Notice: Subject to any disclaimer, the term of this patent is extended or adjusted under 35 U.S.C. 154(b) by 746 days.

(21) Appl. No.: 12/198,374

(22) Filed: Aug. 26, 2008

(65) Prior Publication Data

US 2009/0063052 A1 Mar. 5, 2009

(30) Foreign Application Priority Data

Aug. 27, 2007 (JP) ................................. 2007-220169

(51) Int. Cl.
*G05D 1/00* (2006.01)
*B61B 13/00* (2006.01)

(52) U.S. Cl. ..................... 246/122 R; 246/176; 246/220; 246/253; 246/249

(58) Field of Classification Search .............. 246/122 R, 246/122 A, 220, 176, 253, 194, 34 A, 111, 246/115, 117, 126, 125, 128, 219, 249; 191/10; 104/130.01, 130.07; 701/300, 301
See application file for complete search history.

(56) References Cited

U.S. PATENT DOCUMENTS

| | | | | |
|---|---|---|---|---|
| 4,711,418 A | * | 12/1987 | Aver et al. | 246/5 |
| 4,768,740 A | * | 9/1988 | Corrie | 246/25 |
| 4,986,498 A | * | 1/1991 | Rotter et al. | 246/458 |
| 5,050,823 A | * | 9/1991 | Parker | 246/5 |
| 5,467,946 A | * | 11/1995 | Doehler | 246/122 A |
| 6,198,993 B1 | * | 3/2001 | Higashi et al. | 701/23 |
| 6,556,898 B2 | * | 4/2003 | Clawson | 701/19 |
| 7,350,754 B2 | * | 4/2008 | Pierson | 246/122 A |
| 7,810,761 B2 | * | 10/2010 | Parisi et al. | 246/253 |
| 2005/0145753 A1 | * | 7/2005 | Beaman et al. | 246/220 |

FOREIGN PATENT DOCUMENTS

| | | |
|---|---|---|
| JP | 10-301626 | 11/1998 |
| JP | 2004-046373 | 2/2004 |
| JP | 2005-115590 | 4/2005 |

* cited by examiner

*Primary Examiner* — Mark Le
(74) *Attorney, Agent, or Firm* — Young & Thompson

(57) ABSTRACT

A transporting system is provided with: a track having a junction point; a plurality of transporting vehicles, each travelling on the track; and a transferring device which has (i) a left portion disposed on an edge on a left side of each of two track portions that are located at least before the junction point of the track with respect to a travelling direction of each transporting vehicle as a standard and (ii) a right portion disposed on an edge on a right side, and which can transfer a signal between the left portion in one of the two track portions and the right portion in another of the two track portions, and between the right portion in said one of the two track portions and the left portion in said another of the two track portions. Each of the transporting vehicle is provided with: a transmitting device for transmitting the signal through one of the right portion and the left portion, in order to prevent collision at the junction point; a first receiving device for receiving the signal through another of the right portion and the left portion; and a second receiving device for receiving the signal transmitted by the transmitting device, through said one of the right portion and the left portion, in order to confirm a transfer operation through the transferring device.

4 Claims, 5 Drawing Sheets

TRANSPORTING SYSTEM, AND METHOD OF CONTROLLING THE TRANSPORTING SYSTEM

BACKGROUND OF THE INVENTION

1. Field of the Invention

The present invention relates to a transporting system provided with transporting vehicles or the like for transporting a transported object, for example, various substrates and the like for manufacturing semiconductor devices, and a method of controlling the transporting system. Here, the "transported object" means a product, an intermediate product, a part, an article, a work, a partly-finished good, a good or the like, or means a box or container for containing such a product or the like, which has been transported or is to be transported by the apparatus.

2. Description of the Related Art

As this type of transporting system, there is a system for transporting a transported object by a plurality of transporting vehicles travelling on a track. The track has, for example, turnout points and junctions, and it is possible to transport the transported object to various positions by the transporting vehicles travelling on the track which diverges in a plurality of directions.

Some transporting systems are provided with a collision avoidance system so that the transporting vehicles do not collide with each other at the junction. For example, Japanese Patent Application Laying Open NO. Hei 10-301626 and Japanese Patent Application Laying Open NO. 2005-115590 disclose such a technology that a communication line is provided near the junction and the transporting vehicles communicate with each other, to thereby recognize one another and prevent the collision.

Moreover, on the assumption that there is something wrong with the aforementioned communication, there has been also suggested a technology of stopping the travel of the transporting vehicle when the communication is not properly performed. For example, Japanese Patent Application Laying Open NO. 2004-46373 discloses such a technology that a base signal is outputted aside from a signal used for the communication, to thereby detect a communication failure.

However, in the technology disclosed in the Japanese Patent Application Laying Open NO. 2004-46373 described above, an apparatus or the like for outputting the base signal needs to be provided separately in order to detect the communication failure, which causes technical problems of a complex system and an increased cost.

SUMMARY OF THE INVENTION

It is therefore an object of the present invention to provide a transporting system capable of certainly preventing the collision of transporting vehicles in an easier structure, and a method of controlling the transporting system.

The above object of the present invention can be achieved by a transporting system provided with: a track having a junction point; a plurality of transporting vehicles, each travelling on the track; and a transferring device which has (i) a left portion disposed on an edge on a left side of each of two track portions that are located at least before the junction point of the track with respect to a travelling direction of each transporting vehicle as a standard and (ii) a right portion disposed on an edge on a right side, and which can transfer a signal between the left portion in one of the two track portions and the right portion in another of the two track portions, and between the right portion in said one of the two track portions and the left portion in said another of the two track portions, each of the transporting vehicle provided with: a transmitting device for transmitting the signal through one of the right portion and the left portion, in order to prevent collision at the junction point; a first receiving device for receiving the signal through another of the right portion and the left portion; and a second receiving device for receiving the signal transmitted by the transmitting device, through said one of the right portion and the left portion, in order to confirm a transfer operation through the transferring device.

According to the transporting system of the present invention, in its operation, the plurality of transporting vehicles travel on the track for transportation. The track has the junction point and is provided with the left portion on the edge on the left side of each of the two track portions before the junction point, and the right portion on the edge on the right side. The signal can be transferred by the transferring device between the left portion in one of the two track portions and the right portion in another of the two track portions, and between the right portion in said one of the two track portions and the left portion in the other track portion.

Here, particularly in the present invention, the transporting vehicle for performing the transportation is provided with: the transmitting device for transmitting the signal through one of the right portion and the left portion; the first receiving device for receiving the signal through said another of the right portion and the left portion; and the second receiving device for receiving the signal transmitted by the transmitting device, through said one of the right portion and the left portion. That is, each of the plurality of transporting vehicles is provided with the transmitting device, the first receiving device, and the second receiving device.

In the signal transmission and reception, firstly, the transmitting device of the transporting vehicle that travels in one of the two track portions (hereinafter referred to as a "first transporting vehicle" as occasion demands) transmits the signal through said one of the right portion and the left portion. The transmitted signal is transferred by the transferring device and is received by the first receiving device of the transporting vehicle that travels in said another of the two track portions (herein after referred to a "second transporting vehicle" as occasion demands). At this time, the first receiving device receives the signal through said another of the right portion and the left portion. That is, the signal transmitted through the right portion from the first transporting vehicle is received through the left portion to the second transporting vehicle, and the signal transmitted through the left portion from the first transporting vehicle is received through the right portion to the second transporting vehicle.

The second transporting vehicle receives the signal transmitted by the first transporting vehicle, as described above, to thereby recognize that the first transporting vehicle is travelling in said one of the two track portions. Thus, it is possible to prevent the first transporting vehicle and the second transporting vehicle from colliding with each other at the junction point.

Moreover, in the present invention, the signal transmitted through said one of the right portion and the left portion from the first transporting vehicle is transferred by the transferring device and is received through said one of the right portion and the left portion of the second receiving device of the first transporting vehicle. That is, the signal transmitted through the right portion of the first transporting vehicle is received through the right portion of the first transporting vehicle, and the signal transmitted through the left portion of the first transporting vehicle is received through the left portion of the first transporting vehicle.

At this time, if the signal is normally performed, the signal is received by the second receiving device. If the signal is not normally performed, the signal is not received by the second receiving device. That is, the first transporting vehicle can know whether or not the signal is normally transferred by receiving the signal that is transmitted by the first transporting vehicle.

If the signal is not normally performed due to a failure of the transmitting device, the transferring device disconnection, or the like, the signal transmitted from the first transporting vehicle is not received by the second transporting vehicle. Thus, there is a possibility that the collision at the junction point cannot be prevented.

In the present invention, however, in particular, as described above, whether or not the signal is received by the second receiving device allows the detection of whether or not the signal is normally transferred. Thus, if the signal is not normally transferred, it is possible to take countermeasures, quickly. This allows the collision at the junction point of the track to be prevented more certainly. At this time, in particular, it is only necessary to provide the second receiving device for each of the transporting vehicles, and it is unnecessary to provide a new member or the like on the track. That is, it is possible to prevent complexity of a whole transporting system and an increased cost.

As explained above, according to the transporting system of the present invention, each of the plurality of transporting vehicles is provided with the transmitting device, the first receiving device, and the second receiving device. By this, it is possible to prevent the collision of the transporting vehicles at the junction point, in the easy structure and more certainly.

In one aspect of the transporting system of the present invention, it is further provided with: a detecting device for detecting the transporting vehicle's entering the junction point, a transmission controlling device for controlling the transmitting device to transmit the signal if the entering is detected; a travel controlling device for controlling the transporting vehicle to stop if the first receiving device receives the signal, the transporting vehicle provided with the first receiving device that receives the signal; and a judging device for judging that the transfer operation is abnormal if the entering is detected and if the second receiving device does not receive the signal.

According to this aspect, the detecting device detects the transporting vehicle's entering the junction point. Incidentally, such detection is performed before, immediately before, or immediately after the transporting vehicle enters the junction point.

If the transporting vehicle's entering the junction point is detected, the transmission controlling device controls the transmitting device of the first transporting vehicle to transmit the signal. Then, if the first receiving device of the second transporting vehicle receives the transmitted signal, the travel controlling device stops the second transporting vehicle's travel. Thus, it is possible to certainly prevent the first transporting vehicle and the second transporting vehicle from colliding with each other at the junction point.

Moreover, if the vehicle's entering the junction point is detected and if the second receiving device of the first transporting vehicle does not receive the signal, the judging device judges that the transfer operation is abnormal. That is, it judges that the signal is not normally performed, due to a failure in the transferring device and the transmitting device or the like. By performing such judgment, it is possible to know the abnormality in the transfer operation, more easily and certainly. Thus, if the signal is not normally transferred, it is possible to take countermeasures, quickly, and it is possible to prevent the collision at the junction point of the track, more certainly.

As explained above, according to the transporting system in this aspect, it is possible to prevent the transporting vehicles from colliding with each other at the junction point, more certainly.

In another aspect of the transporting system of the present invention, the transferring device is a conductive wire installed in a loop shape, and the signal is transferred by an inductive phenomenon in the conductive wire.

According to this aspect, the transferring device is provided with the conductive wire installed in the loop shape. The loop-shaped conductive wire is installed from one track portion to the other track portion at the junction point of the track, for example. Incidentally, a plurality of loop-shaped conductive wires may be installed at one junction point.

The signal transmitted from the transmitting device of the transporting vehicle is transferred by the inductive phenomenon in the conductive wire. Here, for example, if the conductive wire is disconnected or broken, the signal is not transferred because the loop of the conductive wire is disconnected. Thus, as described above, whether or not the second receiving device receives the signal allows the detection of the conductive wire disconnection, certainly. Therefore, in order to normally transfer the signal, it is possible to take countermeasure, quickly.

In another aspect of the transporting system of the present invention, the detecting device has a transmission start mark disposed at an entrance of the junction point, and a reading device, provided for the transporting vehicle, for reading the transmission start mark, and the detecting device detects the entering when the reading device reads the transmission start mark.

According to this aspect, the transmission start mark is disposed at the entrance of the junction point in the track. Incidentally, the "entrance of the junction point" is a position at which the transmission start mark can be read by a reading device described later when the transporting vehicle enters the junction point.

The transporting vehicle is provided with the reading device for reading the transmission start mark. Then, when the reading device reads the transmission start mark, the transporting vehicle's entering the junction point is detected. Thus, it is possible to detect the transporting vehicle's entering the junction point, more certainly. Therefore, it is possible to accurately operate the transmission controlling device and the travel controlling device, and it is possible to prevent the transporting vehicles from colliding with each other at the junction point, more certainly.

In another aspect of the transporting system of the present invention, the travel controlling device controls the transporting vehicle to stop if it is judged that the transfer operation is abnormal.

According to this aspect, if it is judged that the transfer operation is abnormal, the transporting vehicle is controlled to stop by the travel controlling device. That is, if the signal is not received on the second receiving device although it is controlled to transmit the signal from the transmitting device of the first transporting vehicle, the transporting vehicle is controlled to stop even if the signal is not received by the first receiving device of the other transporting vehicle. Incidentally, here, the transporting vehicle that is controlled to stop may be all the transporting vehicles in the transporting system, or only the transporting vehicle that enters the junction point, or only the transporting vehicle that travels near the junction point.

If it is judged that the transfer operation is abnormal, there is a possibility that the aforementioned effect of preventing the transporting vehicles from colliding with each other is not obtained. In contrast, particularly in this aspect, if it is judged that the transfer operation is abnormal, the transporting vehicle is controlled to stop. Therefore, it is possible to prevent the transporting vehicles from colliding with each other at the junction point, more certainly.

The above object of the present invention can be also achieved by a controlling method of preventing collision at a junction point and of confirming a transfer operation through a transferring device in a transporting system provided with: a track having the junction point; a plurality of transporting vehicles, each travelling on the track; and the transferring device which has (i) a left portion disposed on an edge on a left side of each of two track portions that are located at least before the junction point of the track with respect to a travelling direction of each transporting vehicle as a standard and (ii) a right portion disposed on an edge on a right side, and which can transfer a signal between the left portion in one of the two track portions and the right portion in the other track portion, and between the right portion in said one of the two track portions and the left portion in the other track portion, each of the transporting vehicle provided with: a transmitting device for transmitting the signal through one of the right portion and the left portion; a first receiving device for receiving the signal through one of the right portion and the left portion; and a second receiving device for receiving the signal transmitted by the transmitting device, through another of the right portion and the left portion, in order to confirm a transfer operation through the transferring device, the controlling method provided with: a detecting process of detecting the transporting vehicle's entering the junction point, a transmission controlling process of controlling the transmitting device to transmit the signal if the entering is detected; a travel controlling process of controlling the transporting vehicle to stop if the first receiving device receives the signal, the transporting vehicle provided with the first receiving device that receives the signal; and a judging process of judging that the transfer operation is abnormal if the entering is detected and if the second receiving device does not receive the signal.

According to the method of controlling the transporting system of the present invention, as in the case of the transporting system of the present invention described above, it is possible to prevent the transporting vehicles from colliding with each other at the junction point, more certainly.

Incidentally, even the method of controlling the transporting system of the present invention can also adopt the same various aspects as those of the transporting system of the present invention described above.

The nature, utility, and further features of this invention will be more clearly apparent from the following detailed description with reference to preferred embodiments of the invention when read in conjunction with the accompanying drawings briefly described below.

DETAILED DESCRIPTION OF THE PREFERRED EMBODIMENT

The embodiment of the present invention will be explained with reference to the drawings hereinafter. Incidentally, here, a transporting system provided with transporting vehicles of an OHT (Overhead Host Transfer) type is exemplified and explained.

Figure 1:
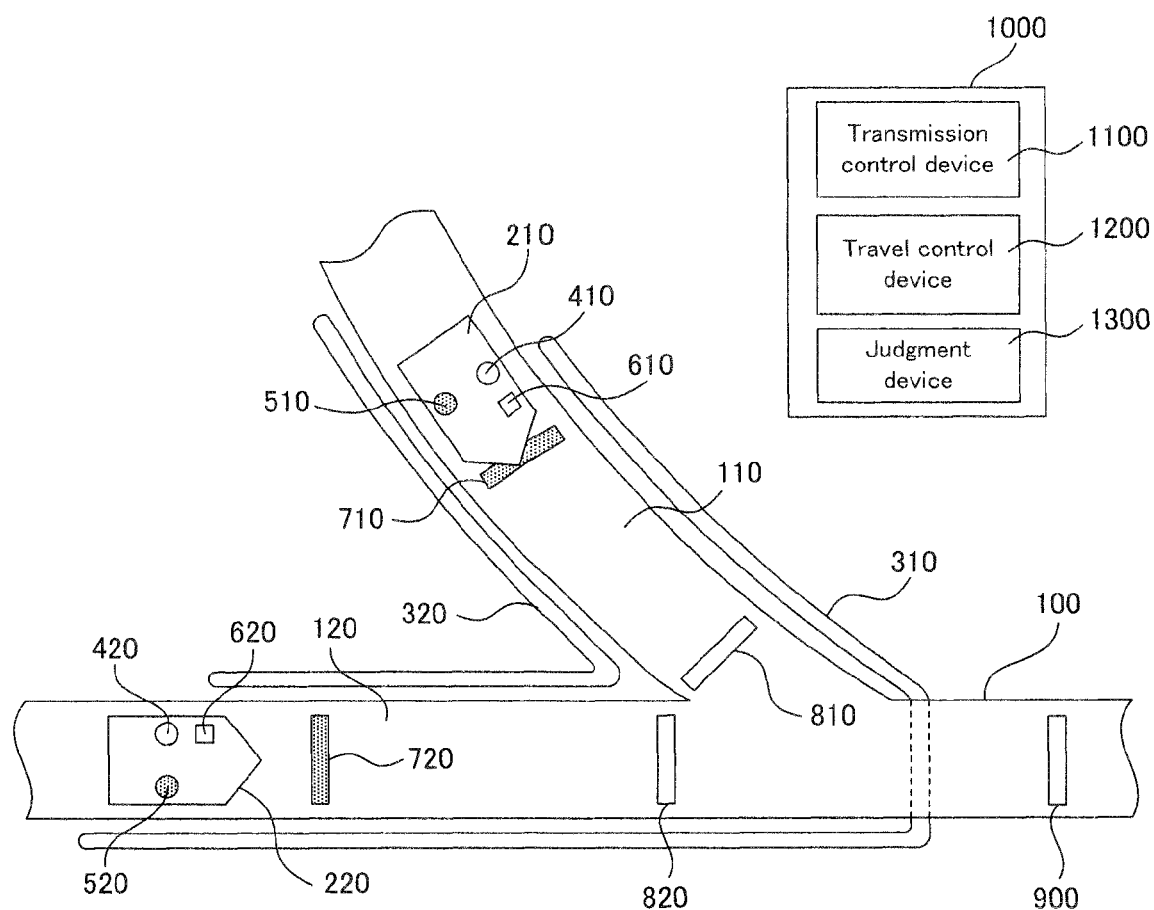
FIG. 1 is a top view showing the structure of a transporting system in an embodiment.
Figure 2:
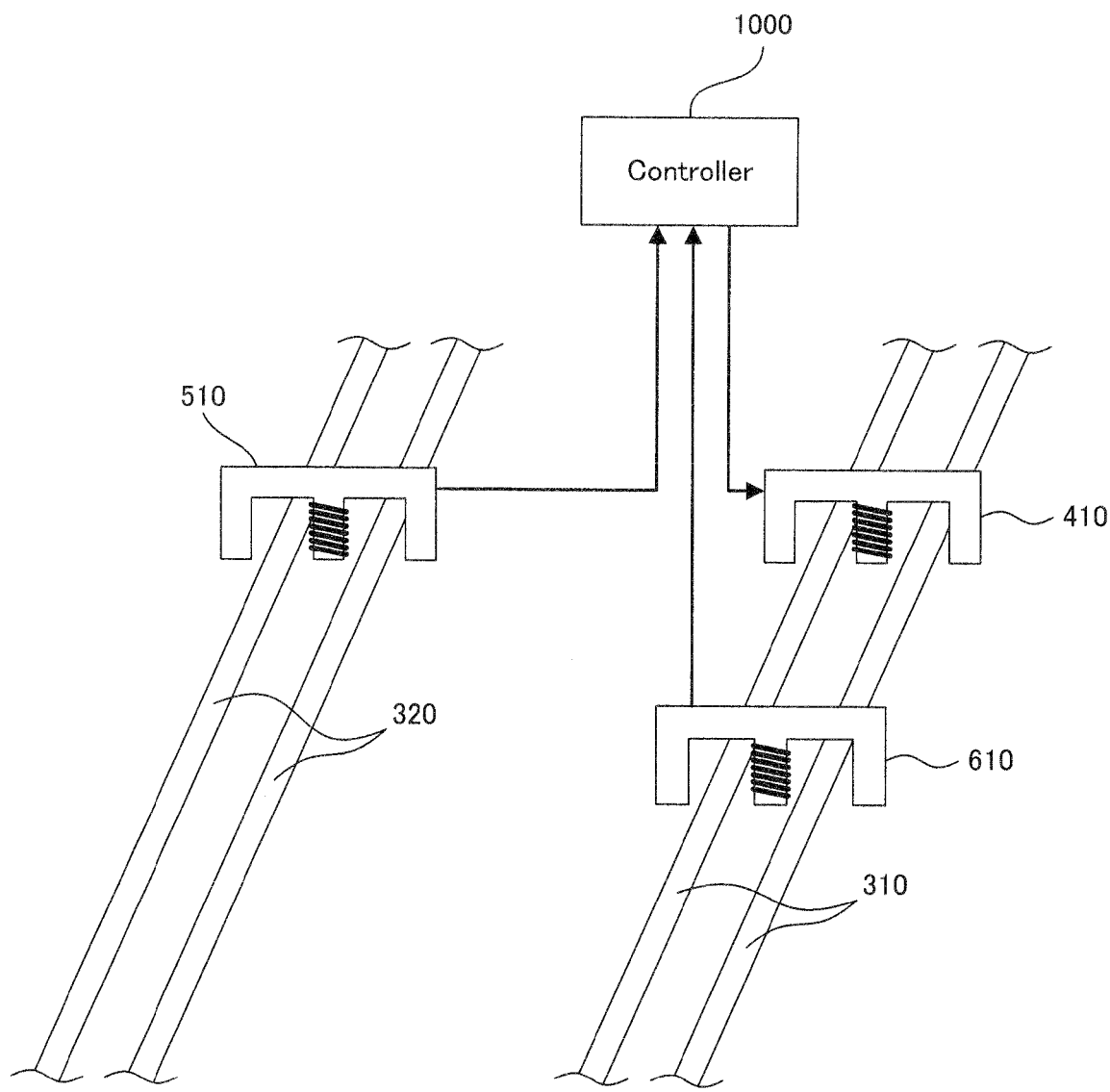
FIG. 2 is a schematic diagram showing the specific structures of a reception device, a transmission device, and a transmission confirmation device.

Firstly, the structure of the transporting system in the embodiment will be explained with reference to FIG. 1 and FIG. 2. FIG. 1 is a top view showing the structure of the transporting system in the embodiment. FIG. 2 is a schematic diagram showing the specific structures of a reception device, a transmission device, and a transmission confirmation device.

In FIG. 1, the transporting system in the embodiment is provided with: a track 100; a first transporting vehicle 210 and a second transporting vehicle 220, as one example of the "transporting vehicle" of the present invention; a first guide wire 310 and a second guide wire 320, as one example of the "transferring device" of the present invention; a first transmission device 410 and a second transmission device 420, as one example of the "transmitting device" of the present invention; a first reception device 510 and a second reception device 520, as one example of the "first receiving device" of the present invention; a first transmission confirmation device 610 and a second transmission conformation device 620, as one example of the "second receiving device" of the present invention; a first start mark 710 and a second start mark 720, as one example of the "transmission start mark" of the present invention; a first stop mark 810 and a second stop mark 820; a transmission stop mark 900; and a controller 1000.

The track 100 is installed on or near a ceiling, for example, and is made of metal, such as aluminum and stainless. Moreover, the track 100 has a first track portion 110 and a second track portion 120, and the two track portions merge into one at a junction point. Incidentally, here, only one junction point is shown; however, a plurality of such junction points may be provided for the track 100. Moreover, in the embodiment, the case where the two track portions merge is explained; however, even in a case where the track 100 has a junction point at which three or more track portions merge, the effect of the present invention described later can be also achieved.

Each of the first transporting vehicle 210 and the second transporting vehicle 220 is mounted to be hanging from the track 100 and travels along the track 100, to thereby transport a transported object, such as a semiconductor substrate. Incidentally, typically, more transporting vehicles (e.g. several dozens or several hundreds of transporting vehicles) are provided on the track 100; however, hereinafter, for convenience of explanation, the two transporting vehicles of the first transporting vehicle 210 and the second transporting vehicle 220 are used for the explanation.

The first guide wire 310 and the second guide wire 320 are loop-shaped conductive wires and are installed at the junction point at which the first track portion 110 and the second track portion 120 merge. The first guide wire 310 is installed from the lateral on the left side based on the travelling direction of the transporting vehicle (hereinafter merely referred to as the "left side" as occasion demands) in the first track portion 110 to the lateral on the right side based on the travelling direction of the transporting vehicle (hereinafter merely referred to as the "right side" as occasion demands) in the second track portion 120. The second guide wire 320 is installed from the lateral on the right side in the first track portion 110 to the lateral on the left side in the second track portion 120. The first guide wire 310 and the second guide wire 320 can transfer signals between the transporting vehicle travelling in the first track portion 110 (i.e. the first transporting vehicle 210) and the transporting vehicle travelling in the second track portion 120 (i.e. the second transporting vehicle 220).

The first transmission device 410 and the second transmission device 420 are, for example, coils and are provided on the edges on the left side of the first transporting vehicle 210 and the second transporting vehicle 220, respectively. The first transmission device 410 and the second transmission device 420 transmit signals by inducing inductive currents (i.e. faradic) on the first guide wire 310 and the second guide wire 320 described above.

The first reception device 510 and the second reception device 520 are, for example, coils and are provided on the edges on the right side of the first transporting vehicle 210 and the second transporting vehicle 220 (i.e. on the opposite edges to the first transmission device 410 and the second transmission device 420 described above), respectively. The first reception device 510 and the second reception device 520 receive signals by detecting the currents flowing in the first guide wire 310 and the second guide wire 320.

The first transmission confirmation device 610 and the second transmission confirmation device 620 are, for example, coils and are provided on the edges on the left side of the first transporting vehicle 210 and the second transporting vehicle 220 (i.e. on the same edges as the first transmission device 410 and the second transmission device 420 described above), respectively. The first transmission confirmation device 610 and the second transmission confirmation device 620 receive signals by detecting the currents flowing in the first guide wire 310 and the second guide wire 320.

Hereinafter, taking the first transporting vehicle 210 for example, an explanation will be given on the specific structures of the transmission device, the reception device, and the transmission confirmation device described above.

In FIG. 2, the first transmission device 410 and the first transmission confirmation device 610 are provided in such a form that coils are disposed within the loop-shaped first guide wire 310. The first reception device 510 is provided in such a form that a coil is disposed within the loop-shaped second guide wire 320. That is, the first reception device 510 receives a signal received by the second reception device 420 in the second transporting vehicle 220. The first transmission confirmation device 610 receives a signal transmitted by the first transmission device 410. Incidentally, each of the first transmission device 410, the first reception device 510, and the first transmission confirmation device 610 is electrically connected to the controller 1000 described later.

Back in FIG. 1, the first start mark 710 and the second start mark 720 are marks that can be read by reading devices (not illustrated), which are provided for the respective plurality of transporting vehicles and which are one example of the "reading device" of the present invention. The first start mark 710 and the second start mark 720 are disposed at positions at which they are read by the reading devices provided for the transporting vehicles when the transporting vehicles reach to the junction point on the track 100 (for example, when the transmission devices, the reception devices, and the transmission confirmation devices described above can transmit and receive signals using the guide wires).

The first stop mark 810 and the second stop mark 820 are marks that can be read by the reading devices, as in the first start mark 710 and the second start mark 720. The transmission stop mark 900 is disposed at a position at which it is read by the transporting vehicle that passes the junction point, as shown in FIG. 1.

The controller 1000 has: a transmission control device 1100 as one example of the "transmission controlling device" of the present invention; a travel control device 1200 as one example of the "travel controlling device" of the present invention; and a judgment device 1300 as one example of the "judging device" of the present invention. The controller 1000 includes, for example, a memory, an arithmetic circuit, and the like. The controller 1000 is electrically connected to each device in the transporting system and controls the whole system.

Next, the operation of the transporting system in the embodiment will be explained with reference to FIG. 3 to FIG. 5 in addition to FIG. 1. Here, it will be explained in both cases where a signal is normally transferred and not normally transferred. Incidentally, the case where a signal is not normally transferred is, for example, a case where a signal is not transmitted due to a failure of the transmission device, a case where a signal is not transferred due to the guide wire disconnection, or the like.

Hereinafter, a case where the first transporting vehicle 210 reaches to the junction point from the first track portion 110 on the track 100 immediately before the second transporting vehicle 220 reaches to the junction point from the second track portion 120, will be exemplified and explained.

<Case 1>

Firstly, the case where a signal is normally transferred will be explained with reference to FIG. 1, FIG. 3, and FIG. 4. FIG. 3 is a flowchart showing the operation of the transporting system in the case 1. FIG. 4 is a top view showing the operation of transporting vehicles in the case 1.

Figure 3:
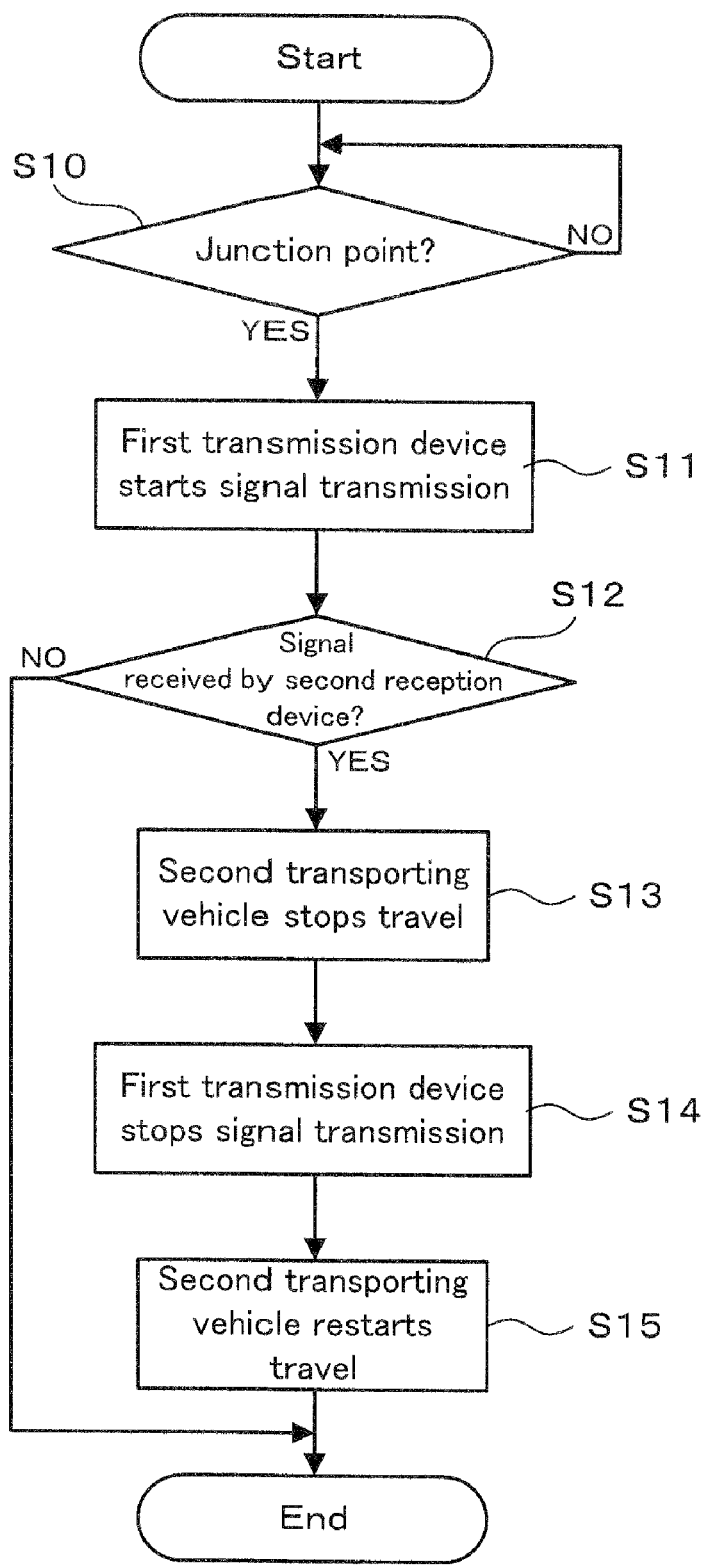
FIG. 3 is a flowchart showing the operation of the transporting system in a case 1.

In FIG. 3, in operation of the transporting system in the embodiment, the controller 1000 always monitors whether or not the transporting vehicle enters the junction point, from whether or not the first start mark 710 is read (step S10). When the first transporting vehicle 210 reaches to the junction point (i.e. when it reaches to the position shown in FIG. 1), the reading device provided for the first transporting vehicle 210 reads the first start mark 710. By this, if it is detected that the first transporting vehicle 210 enters the junction point (the step S10: YES), the transmission control device 1100 makes the first transmission device 410 to start the signal transmission (step S11). The transmitted signal is transferred by the first guide wire 310.

Here, as shown in FIG. 1, under the assumption that the second transporting vehicle 220 is travelling in the second track portion 120, the transferred signal is received by the second reception device 520 in the second transporting vehicle 220 (step S12: YES). If the second reception device 520 receives the signal, the controller 1000 recognizes that there is a possibility that the transporting vehicles collide with each other at the junction point. Incidentally, the transferred signal is also received by the first transmission confirmation device 610.

In the aforementioned case (the step S12: YES), the travel control device 1200 controls the second transporting vehicle 220 to stop the travel. The controlled second transporting vehicle 220 stops after it travels up to the position at which the second stop mark 820 is read (step S13). Incidentally, the transporting vehicle that is controlled to stop the travel is not necessarily the second transporting vehicle 220. Even if it controls the first transporting vehicle 210 to stop the travel, it is also possible to obtain an effect described later. Moreover, between when the transporting vehicle is controlled to stop the travel and when it stops, the transporting vehicle may be slowed down from the normal travel (i.e. a traveling speed may be reduced).

Moreover, the second transporting vehicle 220 whose travel has been controlled reads the second start mark 720 when travelling up to the position of the second stop mark 820. In this case, the second transmission device 420 may be set not to transmit the signal.

Figure 4:
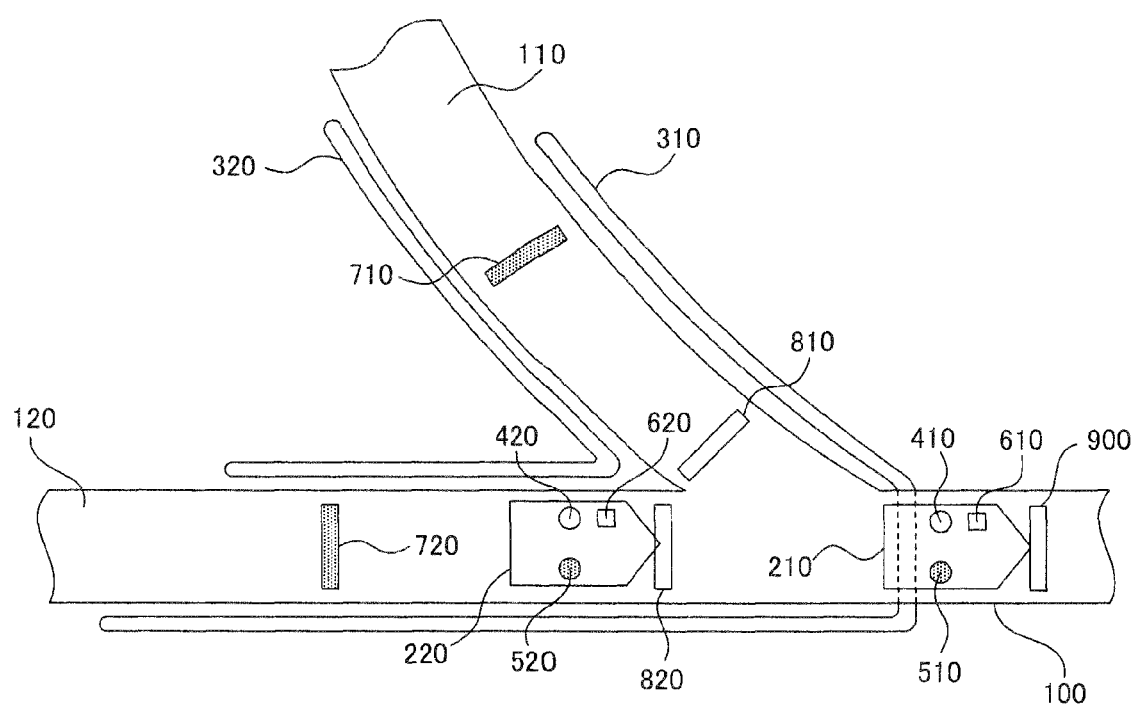
FIG. 4 is a top view showing the operation of transporting vehicles in the case 1.

In FIG. 4, the first transporting vehicle 210 passes the junction point while the second transporting vehicle 220 stops the travel. Then, if the transmission stop mark 900 is read by the reading device, the signal transmission is stopped (step S14).

On the other hand, the second transporting vehicle 220 that has stopped the travel remains at rest while receiving the signal, and when there is no more signal reception (i.e. when the first transporting vehicle 210 passes the junction point and the signal is no longer transmitted), the second transporting vehicle 220 restarts the travel (step S15).

On the other hand, if the second transporting vehicle 220 is not travelling in the second track portion 120, the transferred signal is not received by the second reception device 520 in the second transporting vehicle 220 (the step S12: NO), so there is no need to perform control to stop the transporting vehicle when the first transporting vehicle 210 passes the junction point.

As described above, in the case where a signal is normally transferred, the signal from the transporting vehicle travelling in one track portion (i.e. the first transporting vehicle 210) is received by the transporting vehicle travelling in another track portion (i.e. the second transporting vehicle 220), and any one of the transporting vehicles is controlled with regard to the travel. By this it is possible to prevent the transporting vehicles from colliding with each other.

<Case 2>

Next, the case where a signal is not normally transferred will be explained with reference to FIG. 5 in addition to FIG. 1. FIG. 5 is a flowchart showing the operation of the transporting system in the case 2.

Figure 5:
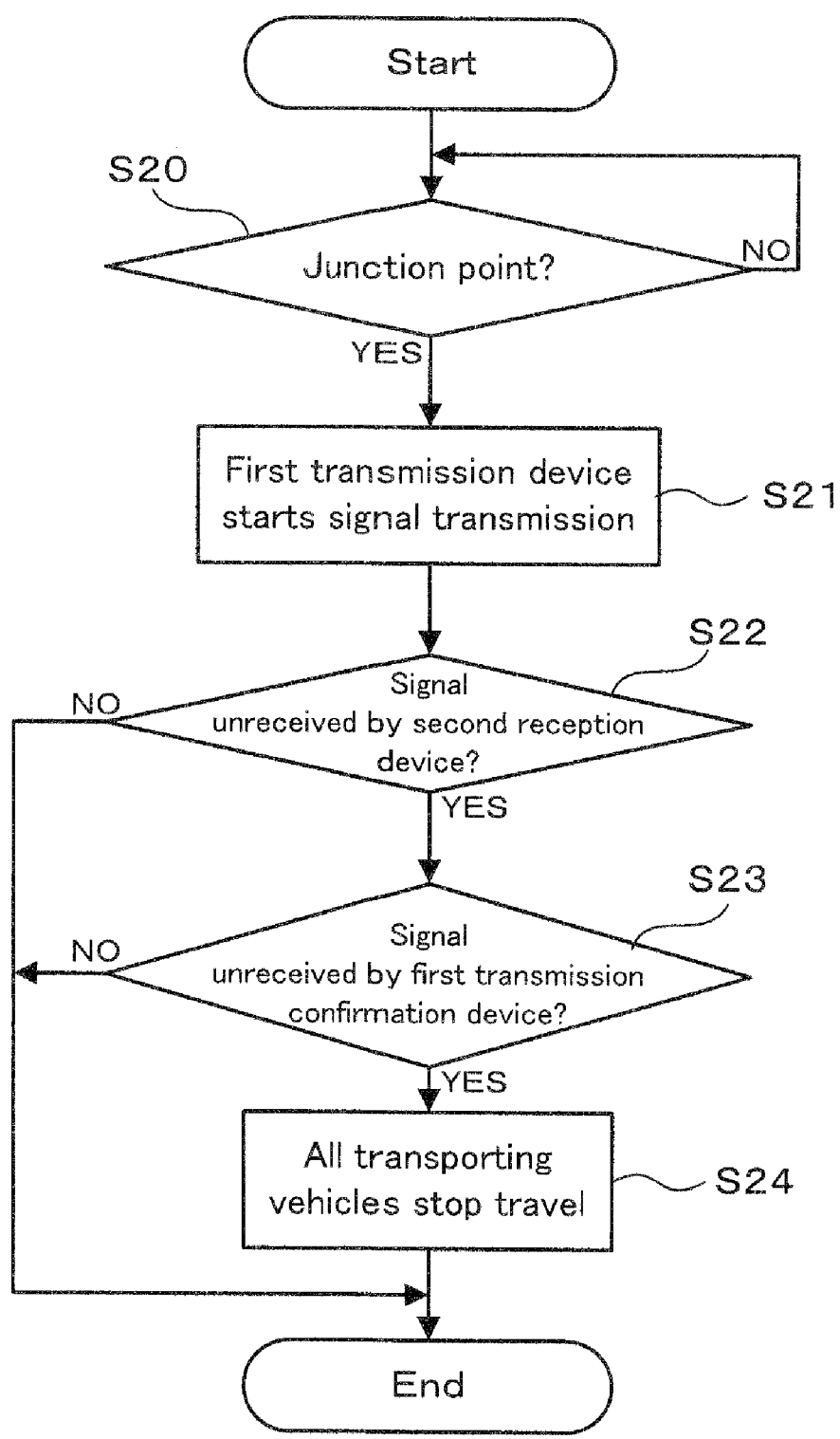
FIG. 5 is a flowchart showing the operation of the transporting system in a case 2.

In FIG. 5, in operation of the transporting system in the embodiment, the controller 1000 always monitors whether or not the transporting vehicle enters the junction point, from whether or not the first start mark 710 is read (step S20). When the first transporting vehicle 210 reaches to the junction point (the step S20: Yes), the first transmission device 410 in the first transporting vehicle 210 is controlled to start the signal transmission, as in the Case 1 described above (step S21).

Here, in particular, in the case where a signal is not normally transferred even if the second transporting vehicle is travelling in the track portion 120, a signal is not received on the second reception device 520 (step S22: YES). Thus, as opposed to the Case 1 described above, the controller 1000 cannot recognize that there is a possibility that the transporting vehicles collide with each other at the junction point.

In the aforementioned case (the step S22: YES), in the condition that a signal is not normally transferred, a signal is not received even on the first transmission confirmation device 610 in the transporting system in the embodiment (step S23: YES). As described above, if the signal is not received on the first transmission confirmation device 610 even if it is controlled to transmit the signal from the first transmission device 410, the judgment device 1300 judges that a signal is not normally transferred. By this, the first transporting vehicle 210 can detect on its own that a signal is not normally transferred. Thus, for example, even if the first transporting vehicle 210 and the second transporting vehicle 220 do not share information about the signal transmission and reception through the controller 1000 or the like, it is possible to detect that a signal is not normally transferred.

Then, the travel control device 1200 controls all the transporting vehicles to stop the travel in the transporting system (step S24). By this, it is possible to take countermeasures, quickly, against the transmission device or the guide wire that does not operate normally. Incidentally, if a signal can be normally transferred without stopping the operation of the transporting system, there is no need to stop the travel of all the transporting vehicles, and, for example, only a predetermined transporting vehicle (e.g. a transporting vehicle travelling near the junction point) may be stopped.

On the other hand, if a signal is received on the first reception device 510 (the step S22: NO), the operation explained in the Case 1 is performed. Moreover, if a signal is received on the first transmission confirmation device 610 (the step S23: NO), it is judged that a signal is normally transferred and that the second transporting vehicle 220 dos not enter the junction point. That is, when the first transporting vehicle 210 passes the junction point, there is no need to perform control to stop the transporting vehicle.

As described above, according to the transporting system in the embodiment, in addition to the case where a signal is normally transferred, as explained in the Case 1, even in the case where a signal is not normally transported, it is possible to prevent the transporting vehicles from colliding with each other.

Incidentally, in the Case 1 and the Case 2 described above, the case where the first transporting vehicle 210 enters the junction point first; however, if the second transporting vehicle 220 enters first, a signal is transferred from the second transmission device 420 in the second transporting vehicle 220 and the operation described above is performed. Moreover, with regard to the travel control for the transporting vehicle, for example, the track portions may be prioritized, and even if the transporting vehicle travelling in the first track portion 110 enters the junction point after the other, it may be controlled to pass the junction point first.

The invention may be embodied in other specific forms without departing from the spirit or essential characteristics thereof. The present embodiments are therefore to be regarded in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2007-220169 filed on Aug. 27, 2007 including the specification, claims, drawings and summary is incorporated herein by reference in its entirety.

What is claimed is:

1. A transporting system comprising:
   a track having first track portion, a second track portion and a junction point to which the first track portion and second track portion are mutually joined;
   a plurality of transporting vehicles, each travelling on said track; and
   a transferring device comprises (i) a first guide wire disposed on a left side of the first track portion and to a right side of the second track portion with respect to a travelling direction of each transporting vehicle as a standard and (ii) a second guide wire disposed on a right side of the first track portion to a left side of the second track portion with respect to a travelling direction of each transporting vehicle as the standard and the transferring device can transfer a signal through said first guide wire and second guide wire, each of said transporting vehicle comprising:

a transmitting device for transmitting the signal through one of the first guide wire and the second guide wire, in order to prevent collision at the junction point and the transmitting device disposed on an edge of a one side with respect to a travelling direction of each transporting vehicle as the standard;

a first receiving device for receiving the signal transmitted by the transmitting device, and the first receiving device disposed on an edge of an other side with respect to a travelling direction of each transporting vehicle as the standard; and a second receiving device for receiving the signal transmitted by the transmitting device in order to confirm a transfer operation through said transferring device and disposed on the edge of the one side with respect to a travelling direction of each transporting vehicle as the standard, the transporting system further comprising:

a detecting device for detecting said transporting vehicle's entering the junction point;

a transmission controlling device for controlling the transmitting device to transmit the signal upon the entering being detected;

a judging device for judging that the transfer operation is abnormal upon the entering being detected and upon the second receiving device failing to receive the signal; and a travel controlling device for controlling said transporting vehicle to stop (i) upon the first receiving device receives the signal, said transporting vehicle comprising the first receiving device that receives the signal; and (ii) upon judging that the transfer operation is abnormal, said transporting vehicle comprising the second recovering device failing to receive the signal.

2. The transporting system according to claim 1, wherein said transferring device is a conductive wire installed in a loop shape, and the signal is transferred by an inductive phenomenon in the conductive wire.

3. The transporting system according to claim 1, wherein said detecting device has a transmission start mark disposed at an entrance of the junction point, and a reading device, provided for said transporting vehicle, for reading the transmission start mark, and said detecting device detects the entering when the reading device reads the transmission start mark.

4. A controlling method of preventing collision at a junction point and of confirming a transfer operation through a transferring device in a transporting system comprising:

a track having a first track portion and a second track portion and the junction point to which the first track portion and second track portion are mutually joined;

a plurality of transporting vehicles, each travelling on said track; and said transferring device which has (i) first guide wire disposed on a left side of the first track portion and to a right side of the second track portion with respect to a travelling direction of each transporting vehicle as a standard and (ii) a second guide wire disposed on a right side of the first track portion to a left side of the second track portion with respect to a travelling direction of each transporting vehicle as the standard, and the transferring device can transfer a signal through said first guide wire and second guide wire, each of said transporting vehicle comprising:

a transmitting device for transmitting the signal through one of the first guide wire and the second guide wire, and the transmitting device disposed on an edge of a one side with respect to a travelling direction of each transporting vehicle as the standard;

a first receiving device for receiving the signal transmitted by the transmitting device, and disposed on an edge of an other side with respect to a travelling direction of each transporting vehicle as the standard; and a second receiving device for receiving the signal transmitted by the transmitting device, and disposed on the edge of the one side with respect to a travelling direction of each transporting vehicle as the standard, said controlling method comprising:

a detecting process of detecting said transporting vehicle's entering the junction point, a transmission controlling process of controlling the transmitting device to transmit the signal upon the entering being detected;

a judging process of judging that the transfer operation is abnormal upon the entering being detected and upon the second receiving device failing to receive the signal; and a travel controlling process of controlling said transporting vehicle to stop (i) upon the first receiving device receives the signal, said transporting vehicle comprising the first receiving device that receives the signal; and (ii) upon judging that the transfer operation is abnormal, said transporting vehicle comprising the second recovering device fails to receive the signal.

* * * * *